(12) United States Patent
Yamaguchi et al.

(10) Patent No.: US 7,355,259 B2
(45) Date of Patent: Apr. 8, 2008

(54) PHOTODIODE ARRAY AND OPTICAL RECEIVER DEVICE INCLUDING THE SAME

(75) Inventors: Akira Yamaguchi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/207,449

(22) Filed: Aug. 18, 2005

(65) Prior Publication Data

US 2005/0285123 A1 Dec. 29, 2005

Related U.S. Application Data

(62) Division of application No. 10/368,246, filed on Feb. 18, 2003, now Pat. No. 6,949,770.

(30) Foreign Application Priority Data

Feb. 26, 2002 (JP) ............................. 2002-050531

(51) Int. Cl.
*H01L 31/06* (2006.01)

(52) U.S. Cl. .................. 257/461; 257/292; 257/293; 257/439; 257/509; 257/549

(58) Field of Classification Search ................ 257/461, 257/292, 293, 439, 509, 549
See application file for complete search history.

(56) References Cited

U.S. PATENT DOCUMENTS

| | | | | |
|---|---|---|---|---|
| 4,541,168 A | * | 9/1985 | Galie et al. | 438/653 |
| 5,037,507 A | * | 8/1991 | Matz et al. | 216/94 |
| 6,326,649 B1 | * | 12/2001 | Chang et al. | 257/184 |
| 6,448,614 B2 | | 9/2002 | Kubo et al. | |
| 6,835,992 B1 | * | 12/2004 | Swirhun et al. | 257/461 |
| 6,949,770 B2 | * | 9/2005 | Yamaguchi et al. | 257/79 |
| 2003/0160248 A1 | | 8/2003 | Yamaguchi et al. | |
| 2006/0062519 A1 | * | 3/2006 | Kish et al. | 385/37 |

FOREIGN PATENT DOCUMENTS

| | | |
|---|---|---|
| JP | 61-139061 | 6/1986 |
| JP | 01206672 A | 8/1989 |
| JP | 01-240887 | 9/1989 |
| JP | 01206672 | 9/1989 |

(Continued)

*Primary Examiner*—Long Pham
(74) *Attorney, Agent, or Firm*—Fish & Richardson P.C.

(57) ABSTRACT

Disclosed is a photodiode array which includes a plurality of p-i-n photodiodes arrayed on a semi-insulative semiconductor substrate, each photodiode including an n-type semiconductor layer grown on the substrate, an i-type semiconductor layer grown on the n-type semiconductor layer, a p-type semiconductor layer grown on the i-type semiconductor layer, an n-type electrode provided on the n-type semiconductor layer in a region exposed by partially removing the p-type semiconductor layer and the i-type semiconductor layer, and a p-type electrode provided on the p-type semiconductor layer. A trench is provided between the two adjacent photodiodes by partially removing the p-type semiconductor layer, the i-type semiconductor layer, and the n-type semiconductor layer. Consequently, the size and pitch of the photodiodes can be decreased and crosstalk between the photodiodes can be reduced. Also disclosed is an optical receiver device including the photodiode array.

6 Claims, 7 Drawing Sheets

FOREIGN PATENT DOCUMENTS

| | | |
|---|---|---|
| JP | 02-058878 | 2/1990 |
| JP | 05-037005 | 2/1993 |
| JP | 05-095123 | 4/1993 |
| JP | 2000-105327 | 11/2000 |
| JP | 2001-119004 | 4/2001 |
| JP | 2001-144278 | 5/2001 |
| JP | 2001-352094 | 12/2001 |

* cited by examiner

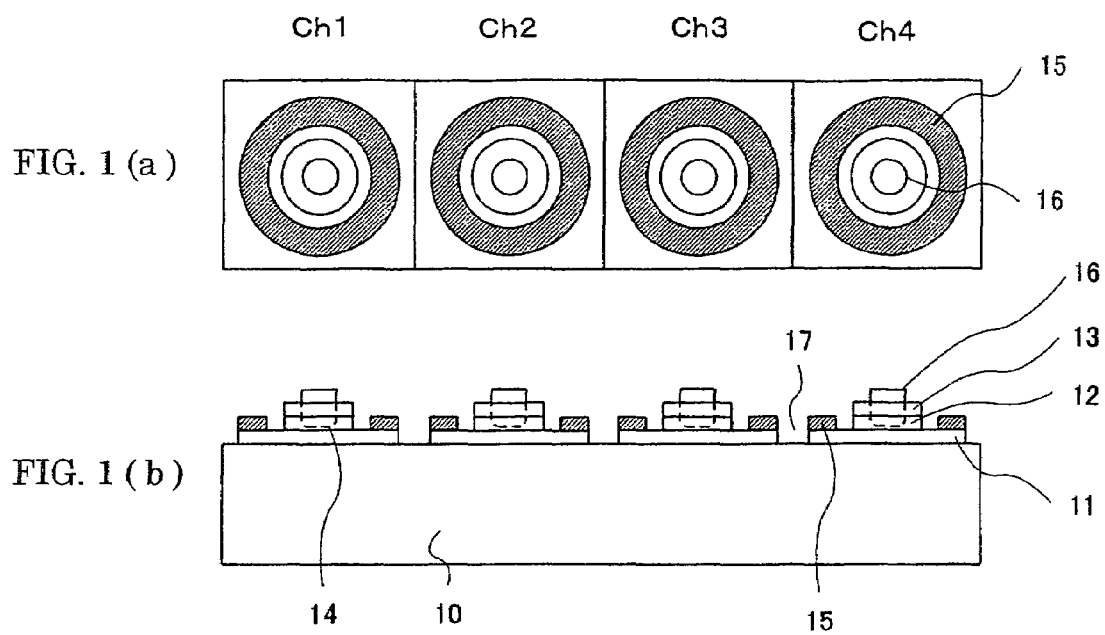
FIG. 1(a)
FIG. 1(b)
FIG. 2
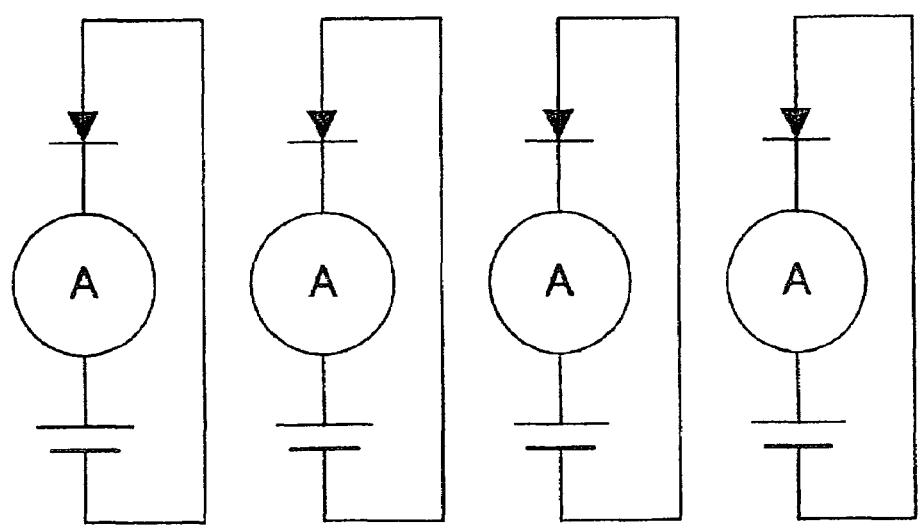

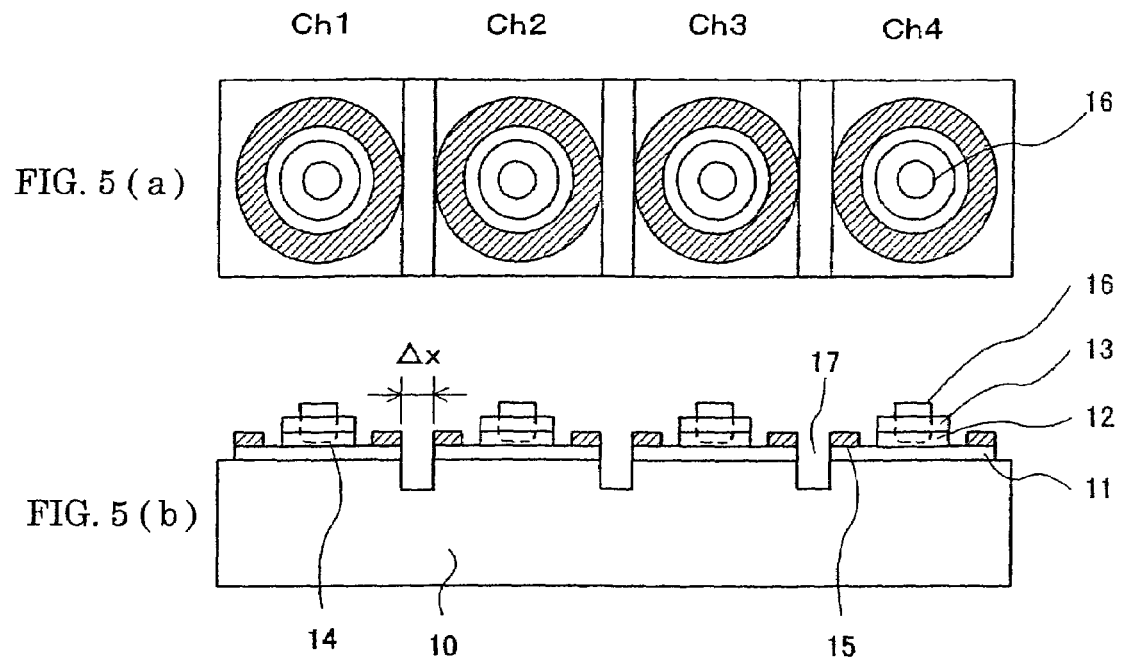
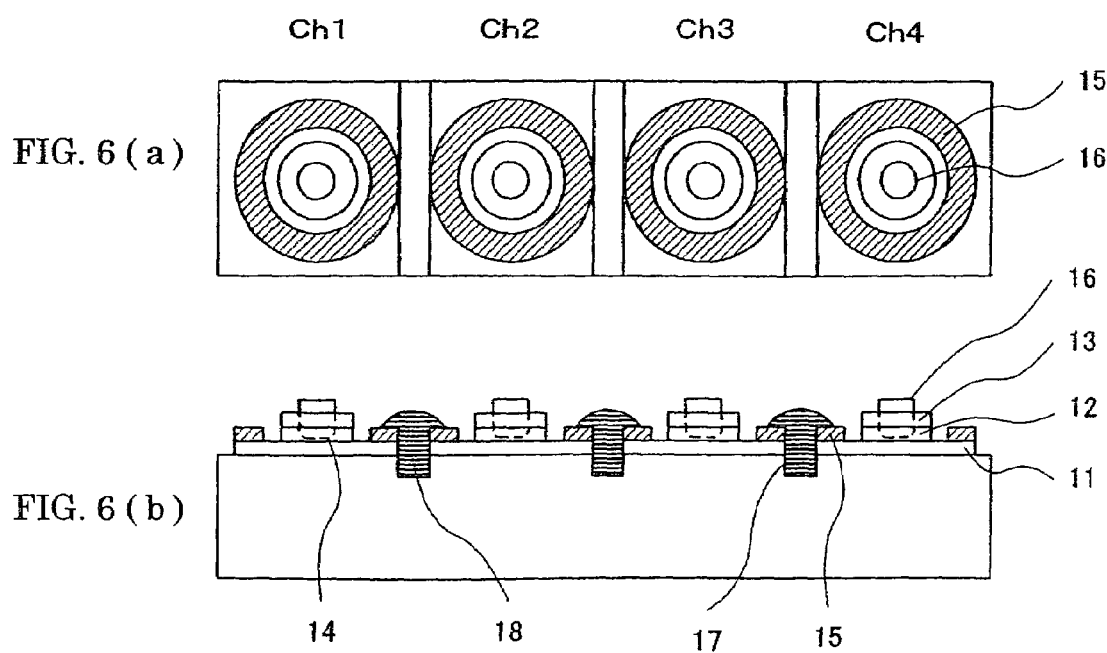

PRIOR ART
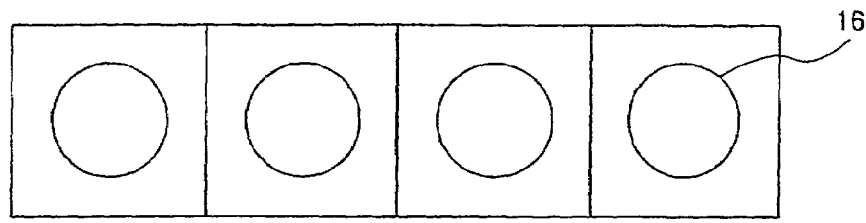
FIG. 9(a)
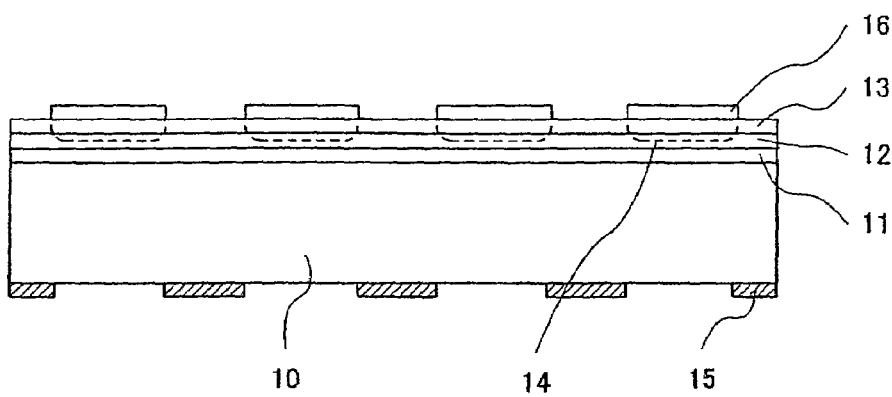
FIG. 9(b)
FIG. 10
PRIOR ART
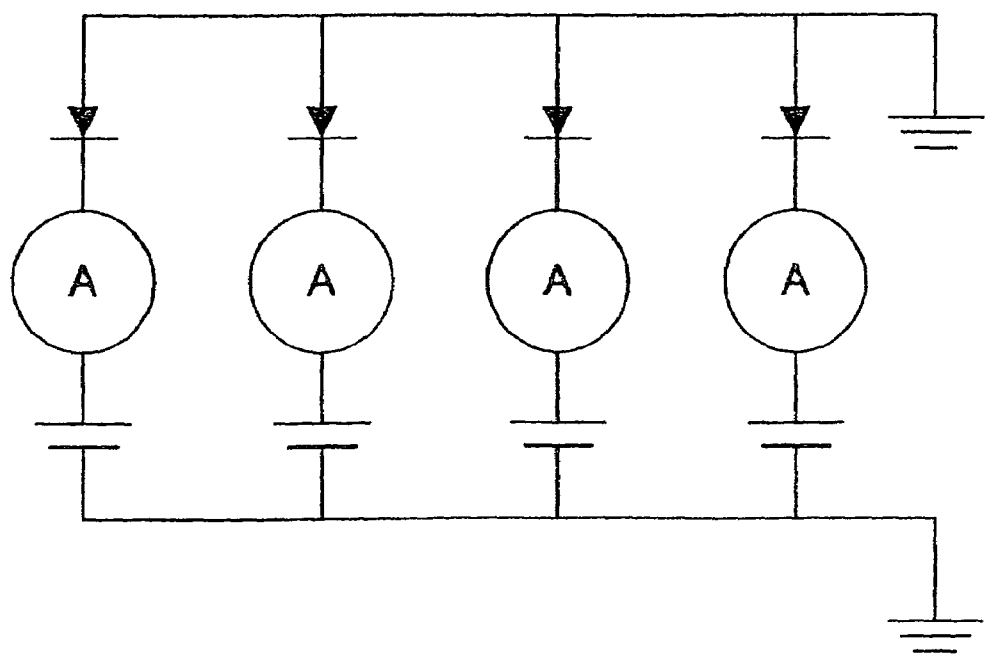

PHOTODIODE ARRAY AND OPTICAL RECEIVER DEVICE INCLUDING THE SAME

CROSS-REFERENCE TO RELATED APPLICATION(S)

This application is a divisional of U.S. Ser. No. 10/368,246, filed Feb. 18, 2003, now U.S. Pat. No. 6,949,770 which in turn claims the benefit of Japanese Application No. 2002-050531, filed Feb. 26, 2002.

BACKGROUND OF THE INVENTION

1. Field of the Invention

The present invention relates to a photodiode array and an optical receiver device including the photodiode array. More particularly, the invention relates to a photodiode array in which the size and pitch of photodiodes can be decreased and crosstalk between the photodiodes can be reduced.

2. Description of the Related Art

An example of a photodiode array used for an optical module is shown in FIGS. 9(a) and 9(b) and FIG. 10. The optical module is used for measuring the intensity of light passing through a multi channel optical fiber array or optical waveguide. The photodiode array used for the module includes a semi-insulative semiconductor substrate 10, and an n-type InP layer 11, an InGaAs layer (light receiving layer) 12, and an InP layer (window layer or cap layer) 13 grown in that order on the substrate. In the InGaAs layer 12 and the InP layer 13, p-type areas 14 are selectively formed by the diffusion of Zn. Light receiving areas (i-type areas between p-type areas and n-type areas) are arrayed at a predetermined distance. A p-type electrode 16 is placed above the p-type area 14, and an n-type electrode 15 of each photodiode is placed on the bottom of the common substrate 10.

However, in the photodiode array described above, crosstalk occurs, resulting in a malfunction. The reason for this is that since the individual photodiodes are formed on the common n-type semiconductor substrate, for example, photo carriers generated in photodiodes Ch1 and Ch3 enter the signal of the adjacent photodiode Ch2, resulting in a malfunction in the photodiode Ch2.

In order to reduce crosstalk, a photodiode array disclosed in Japanese Unexamined Patent Application Publication No. 2001-144278, for example, employs a mesa structure in which the individual photodiodes are isolated by etching. In the photodiode array, by employing the mesa structure, carrier diffusion in the transverse direction between the photodiodes is prevented and crosstalk between the adjacent photodiodes is reduced.

However, in the photodiode array described above, since the signal circuits by photo carriers use a common n-type electrode provided on a common n-type substrate, mixing of signals occurs through the common electrode, and therefore it is difficult to suppress crosstalk sufficiently.

SUMMARY OF THE INVENTION

It is a principal object of the present invention to provide a photodiode array capable of reducing crosstalk between photodiodes and an optical receiver device including the photodiode array.

In the photodiode array according to the present invention, in order to achieve the object mentioned above, a p-type semiconductor layer, an i-type semiconductor layer, and an n-type semiconductor layer are partially removed in each photodiode, and an independent electrode structure is adopted.

That is, in one aspect of the present invention, a photodiode array includes a plurality of p-i-n photodiodes arrayed on a semi-insulative semiconductor substrate, each photodiode including an n-type semiconductor layer grown on the substrate, an i-type semiconductor layer grown on the n-type semiconductor layer, a p-type semiconductor layer grown on the i-type semiconductor layer. A trench is provided between the two adjacent photodiodes by partially removing the p-type semiconductor layer, the i-type semiconductor layer, and the n-type semiconductor layer. An n-type electrode is provided on the n-type semiconductor layer in a region exposed by partially removing the p-type semiconductor layer and the i-type semiconductor layer, and a p-type electrode is provided on the p-type semiconductor layer.

Alternatively, each photodiode may include a p-type semiconductor layer, an i-type semiconductor layer, and an n-type semiconductor layer grown in that order on the substrate. A trench is provided between the two adjacent photodiodes by partially removing the n-type semiconductor layer and the i-type semiconductor layer. In such a case, a p-type electrode is provided on the p-type semiconductor layer in a region exposed by partially removing the n-type semiconductor layer and the i-type semiconductor layer, and an n-type electrode is provided on the n-type semiconductor layer.

In the conventional photodiode array, since the n-type electrode of each photodiode is provided on the common semiconductor substrate, it is not possible to reduce crosstalk. In the present invention, a semi-insulative semiconductor substrate is used, and the n-type layer of each photodiode is isolated from that of an adjacent photodiode, and an n-type or p-type electrode is formed on an n-type or p-type semiconductor layer, respectively, for each photodiode. Thereby, a signal receiving circuit is completely isolated for each photodiode, and crosstalk through the n-type electrode can be reduced.

The trench may reach to the semi-insulative semiconductor substrate. A leakage current between the n-type electrodes is influenced by the surface resistance of the semi-insulative InP substrate, and in particular, by a minimal amount of contaminants and residual water, etc., on the surface. Therefore, as the distance between the two adjacent photodiodes is increased, the photodiodes are less likely to be influenced by such substances, and accordingly crosstalk can be prevented.

The semi-insulative semiconductor substrate may be composed of Fe-doped indium phosphide (InP).

The trench may be filled with a resin which does not transmit receiving light. By such a construction, it is possible to intercept leakage light, scattered light, or stray light from the adjacent channels. Specific examples of the resin which does not transmit light include carbon-containing epoxy resins.

The photodiode array of the present invention may have a structure in which light to be incident on the p-i-n photodiodes enters from the semiconductor substrate side. For example, an antireflective coating may be provided on the rear surface (the surface not provided with the n-type semiconductor layer, i-type semiconductor layer, and p-type semiconductor layer) of the substrate, and a rear electrode provided with a window for incident light may be formed on the antireflective coating. Alternatively, a structure in which light enters from the side of the front surface of the substrate may be adopted.

In another aspect of the present invention, an optical receiver device may have a structure in which the photodiode array and an optical transmission line such as an optical fiber or optical waveguide are disposed on a Si bench such that signals from the optical fiber are transmitted into the photodiode array.

In such a case, an amplifier for the signals from the photodiodes may be placed behind the photodiode array. By using the amplifier, the signals from the photodiodes are amplified and sensitivity is improved.

As described above, in the photodiode array of the present invention, the individual photodiodes are isolated from each other by the trenches, and the n-type or p-type electrode is independently provided, instead of being provided on a common substrate, which results in reduction of crosstalk. Therefore, the photodiode array is suitable for use in optical receiver devices, etc.

BRIEF DESCRIPTION OF THE DRAWINGS

FIG. 1(a) is a plan view of a photodiode array of the present invention, and FIG. 1(b) is a cross-sectional view of the photodiode array shown in FIG. 1(a);

FIG. 2 is an equivalent circuit diagram of the photodiode array shown in FIGS. 1(a) and 1(b);

FIG. 5(a) is a plan view of a photodiode array of the present invention in which trenches extending into a substrate are provided, and FIG. 5(b) is a cross-sectional view of the photodiode array shown in FIG. 5(a);

FIG. 6(a) is a plan view of a photodiode array of the present invention in which trenches extending into a substrate are provided and the trenches are filled with a resin, and FIG. 6(b) is a cross-sectional view of the photodiode array shown in FIG. 6(a);

FIG. 9(a) is a plan view of a conventional photodiode array, and FIG. 9(b) is a cross-sectional view of the photodiode array shown in FIG. 9(a); and FIG. 10 is an equivalent circuit diagram of the photodiode shown in FIGS. 9(a) and 9(b).

DESCRIPTION OF THE PREFERRED EMBODIMENTS

Figure 3:
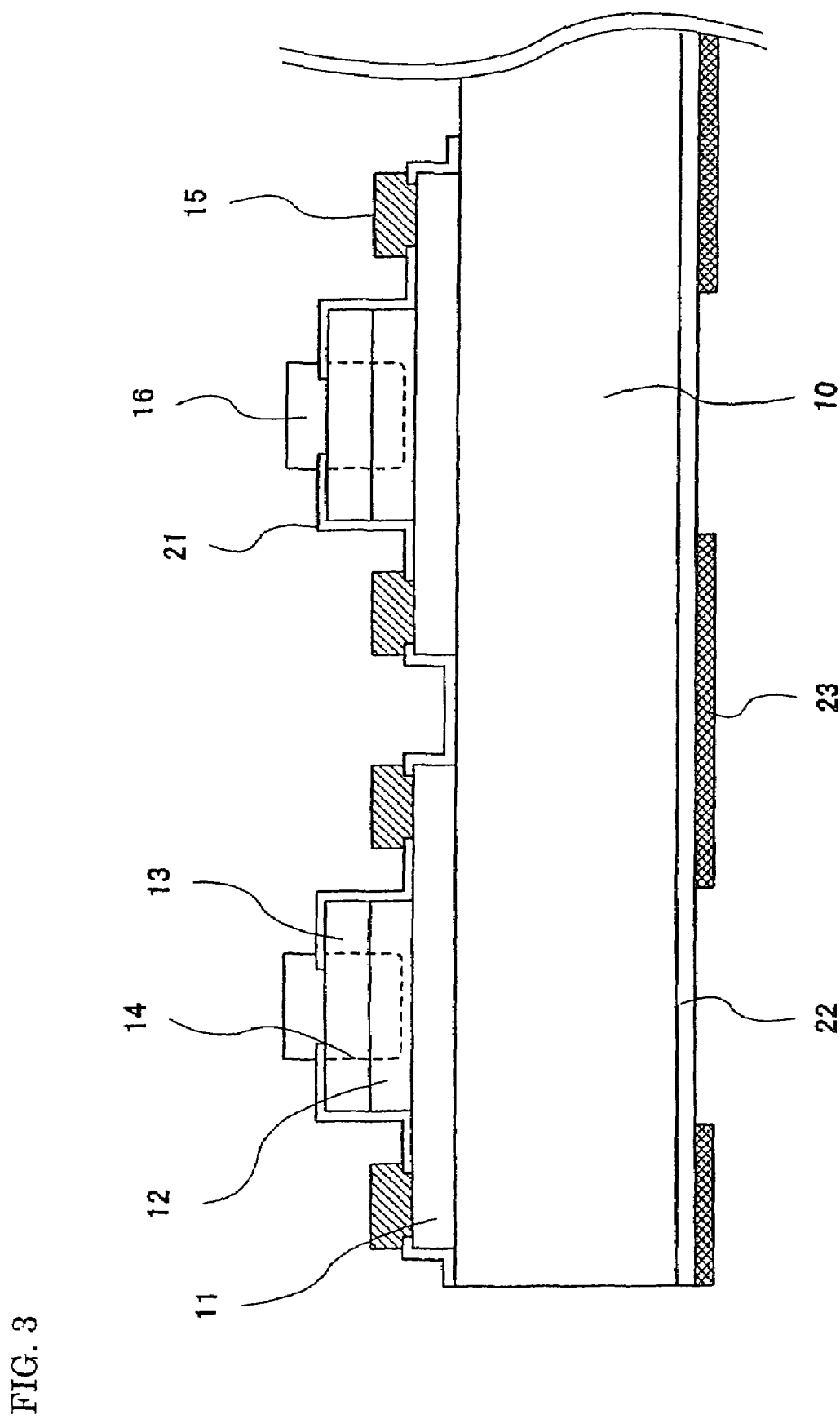
FIG. 3 is an enlarged view of the photodiode array shown in FIGS. 1(a) and 1(b)

The embodiments of the present invention will be described with reference to the drawings. In the drawings, the same elements are represented by the same reference numerals, and duplication of description is avoided. It is to be understood that the dimensional proportions of the individual elements in the drawing do not necessarily correspond to the actual proportions.

(Construction)

Figure 4:
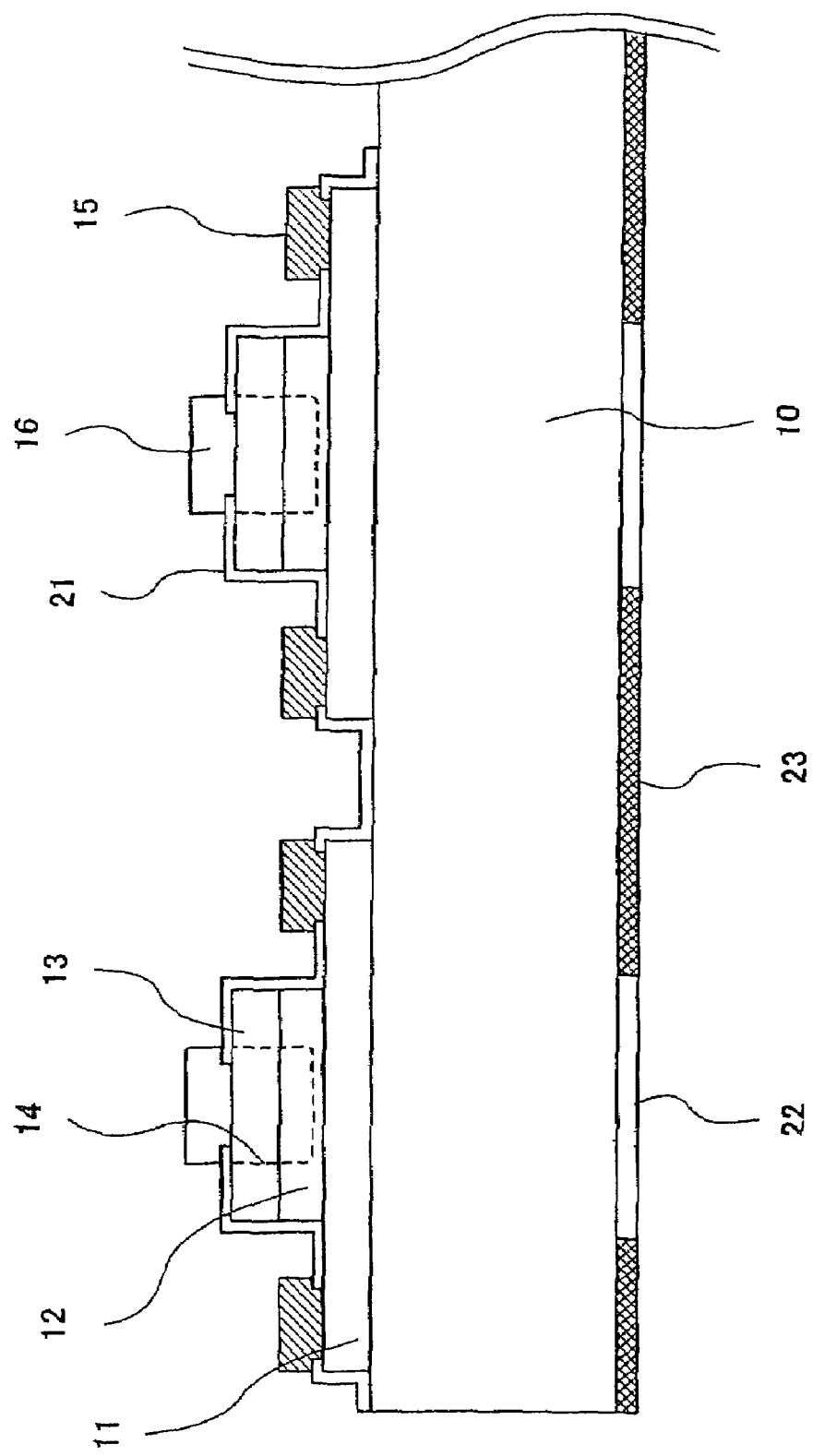
FIG. 4 is an enlarged view which shows a variation of the photodiode array shown in FIG. 3.

FIG. 1(a) is a plan view of a photodiode array of the present invention, and FIG. 1(b) is a cross-sectional view of the photodiode array shown in FIG. 1(a). FIG. 2 is an equivalent circuit diagram of the photodiode array shown in FIGS. 1(a) and 1(b). FIG. 3 is an enlarged view of the photodiode array shown in FIGS. 1(a) and 1(b), and FIG. 4 is an enlarged view which shows a variation of the photo- diode array shown in FIG. 3. On a Fe-doped semi-insulative InP substrate 10, an n-type InP layer 11, an InGaAs layer (light receiving layer) 12, and an InP layer (window layer or cap layer) 13 are grown in that order from the bottom. All of the n-type InP layer 11, the InGaAs layer 12, and the InP layer 13 are circular, and the InGaAs layer 12 and the InP layer 13 have a smaller diameter than that of the n-type InP layer 11. A p-type area 14 is selectively formed in the InGaAs layer 12 and the InP layer 13 by the diffusion of Zn.

An annular n-type electrode 15 is provided on the n-type InP layer 11 in a region exposed by partially removing the InP layer 13 and the InGaAs layer 12 by etching. A circular p-type electrode 16 is formed on the InP layer 13.

The individual photodiodes are isolated by trenches 17 which are formed by removing the n-type InP layer 11, the InGaAs layer 12, and the InP layer 13. In this embodiment, the trenches 17 extend to the surface of the substrate 10. Although the photodiode array is designed to allow light to be incident from the substrate 10 side, a structure in which incident light enters from the front side may be adopted.

(Fabrication Method)

Such a photodiode array is fabricated by a method described below. On a semi-insulative InP substrate 10, an n-type InP layer 11, an InGaAs layer 12, and an InP layer 13 are continuously formed by an organometallic vapor-phase epitaxial method or chloride vapor-phase epitaxial method. The second layer of InGaAs layer 12 is a non-doped high-purity layer, and the third layer of InP layer 13 is a non-doped high-purity layer or an n-type layer. Next, Zn is diffused into the InGaAs layer 12 and the InP layer 13 by a vapor-phase diffusion process to form a p-type area 14.

The peripheries of the InP layer 13 and the InGaAs layer 12 are partially removed by selective etching to expose the n-type InP layer 11 such that a region for an n-type electrode is thereby formed. In the etching process, the surface of the n-type InP layer 11 is exposed by using hydrobromic acid and phosphoric acid in sequence. A reactive ion etching method may be used instead. In such a case, in order to improve efficiency, the InP layer 13 and the InGaAs layer 12 may also be etched so that the n-type InP layer is exposed 11 in the regions between the photodiodes.

Trenches 17 are formed by removing the remaining n-type InP layer 11 between the photodiodes. For that purpose, wet etching using hydrobromic acid and phosphoric acid, or the like, or reactive ion etching may be employed. Alternatively, the trenches 17 may be formed by mechanical processing using a dicing saw or the like.

As shown in FIG. 3, an insulating film 21 composed of $SiO_xN_y$ is formed on the surface of the photodiodes. At this stage, contact holes are formed in the insulating film 21 on the p-type area 14 and on the n-type InP layer 11 exposed by etching. An AuZn-containing p-type electrode 16 is formed on the p-type area 14, and then an AuGeNi-containing n-type electrode 15 is formed on the n-type InP layer 11 exposed by etching. Other material may be used for the p-type electrode 16 or the n-type electrode 15.

An antireflective coating 22 composed of $SiO_xN_y$ is formed on the rear surface of the substrate 10, and a rear electrode 23 composed of TiAu is then formed on the antireflective coating 22. Windows are formed in the rear electrode 23 so that receiving light enters the light receiving layer 12 from the substrate 10 side. Although the antireflective coating 22 is formed on the entire rear surface of the substrate 10 in the embodiment shown in FIG. 3, an antireflective coating 22 may be partially formed on the rear surface of the substrate and rear electrodes 23 may be provided in regions other than the antireflective coating 22 on the rear surface of the substrate as shown in FIG. 4.

In the construction shown in FIGS. 1(a) and 1(b), a leakage current between the n-type electrodes of the individual channels is influenced by the surface resistance of the semi-insulative InP substrate 10, and in particular, by a small amount of contaminants and residual water, etc., on the surface. Therefore, as the separation distance between the two adjacent photodiodes is increased, the photodiodes are less likely to be influenced.

FIG. 5(a) is a plan view of a photodiode array which is designed so that the separation distance between the two adjacent photodiodes is increased, and FIG. 5(b) is a cross-sectional view of the photodiode array shown in FIG. 5(a). For example, if the acceptance surface diameter is 100 μm, the photodiode pitch is 250 μm, and the outer diameter of the n-type electrode 15 is 200 μm, a separation distance Δx between the two adjacent photodiodes is assumed to be 50 μm. Consequently, if a trench 17 is formed so as to enter into the semi-insulative InP substrate 10 at a depth of 50 μm, the separation distance between the n-type electrodes 15 is 150 μm, and thereby the photodiodes are further less likely to be influenced by the surroundings. The trench 17 may be formed in an annular shape corresponding to the shape of the electrode. Alternatively, as shown in FIGS. 5(a) and 5(b), the trench 17 may be formed in a linear shape by dicing.

As shown in FIGS. 6(a) and 6(b), if a trench (slit) 17 that extends into the substrate 10 is formed, for example, at a depth of 100 μm, and the trench 17 is filled with a resin (e.g., carbon-containing epoxy resin) 18 which does not transmit receiving light, it is possible to intercept leakage light, scattered light, or stray light from the adjacent channels.

(Optical Receiver Module)

Figure 7:
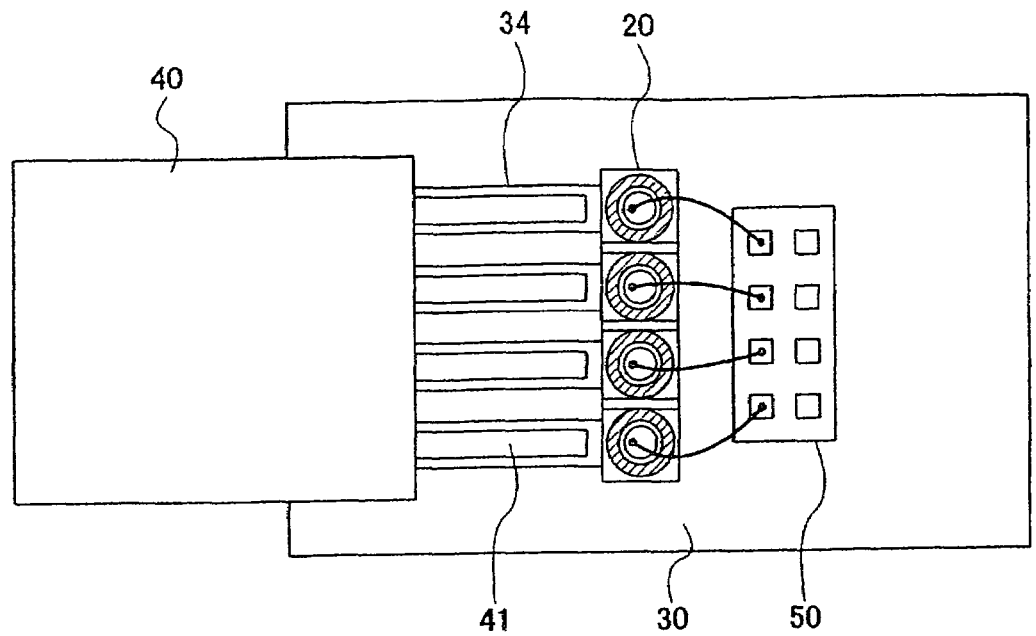
FIG. 7(a) is a plan view of an optical receiver device of the present invention.
FIG. 7(b) is a side view of the optical receiver device shown in FIG. 7(a)
Figure 7:
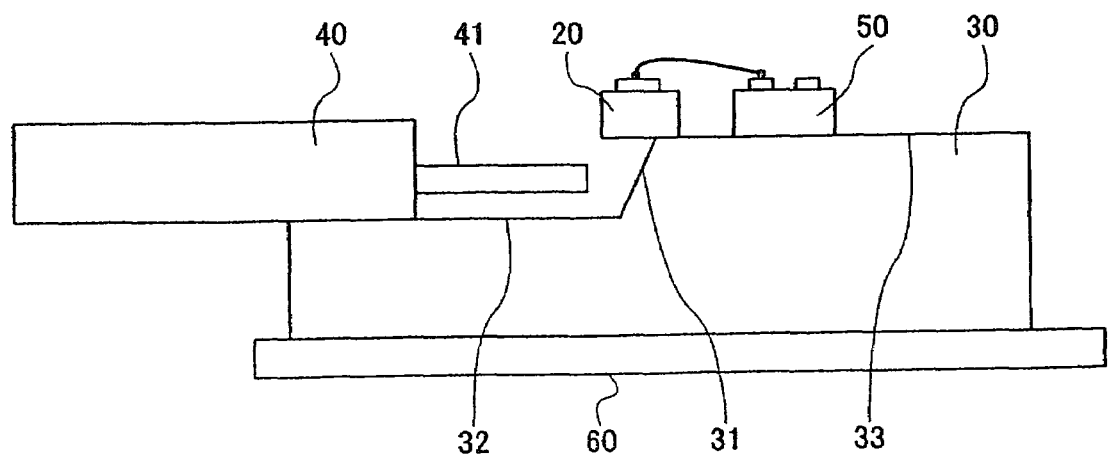

FIG. 7(a) is a plan view of a 4-channel integrated optical receiver device which includes a 4-channel photodiode array fabricated by the method described above, and FIG. 7(b) is a side view of the optical receiver device shown in FIG. 7(a). A 4-channel photodiode array 20 including channels with an acceptance surface diameter of 100 μm is soldered to electrodes formed on a Si bench 30. The Si bench 30 has a step and includes a lower stand 32 and an upper stand 33 with an inclined plane 31 therebetween. On the lower stand 32, a multi-channel connector 40 is fixed and V-grooves 34 for placing optical fibers 41 are provided.

Figure 8:
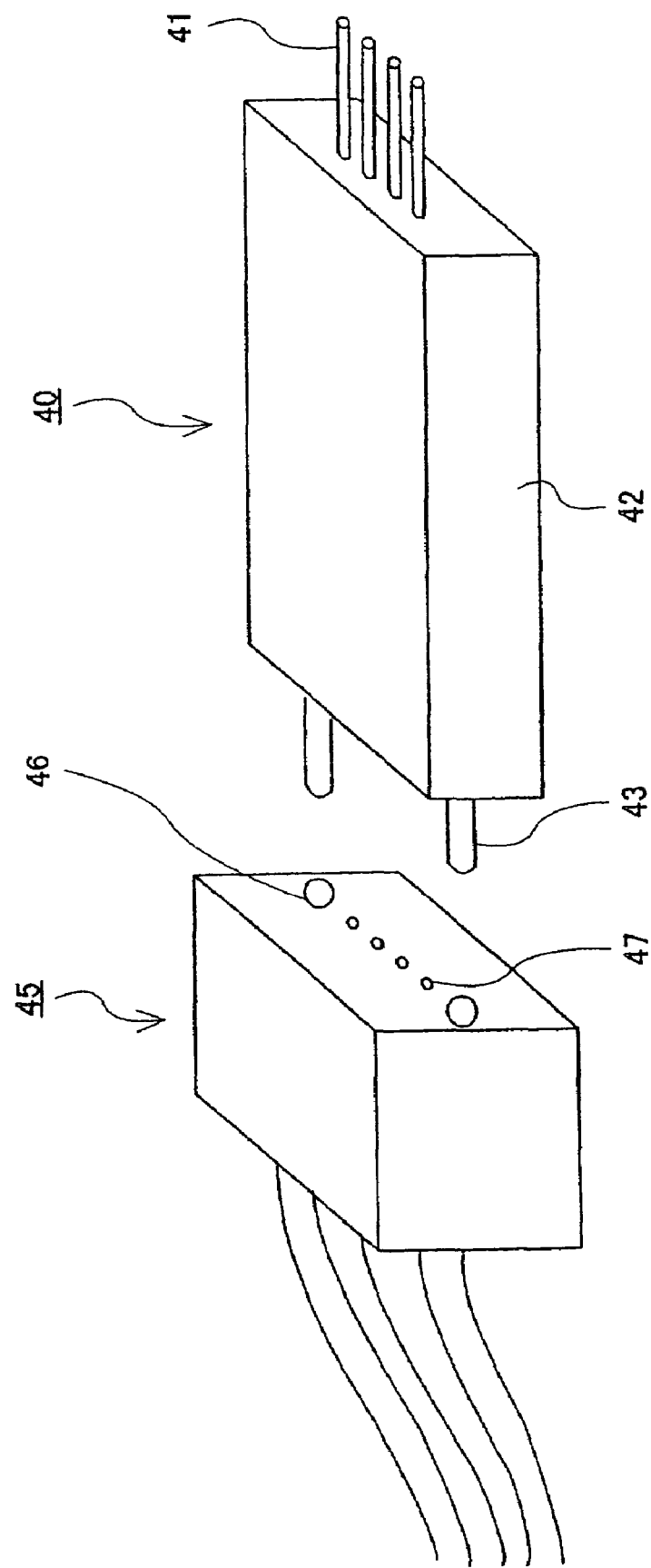
FIG. 8 is an exterior view of a photodiode array of the present invention.

FIG. 8 is an exterior view showing the multi channel connector 40 and an optical fiber ribbon connector 45. In the multi channel connector 40, the optical fibers 41 protrude from one end face of a block-shaped packaging 42, and guide pins 43 protrude from the other end face. On one end of the optical fiber ribbon connector 45, fitting holes 46 are formed and optical fibers 47 are also arranged. By inserting the guide pins 43 into the respective fitting holes 46, the multi channel connector 40 and the optical fiber ribbon connector 45 are connected to each other.

The photodiode array 20 is mounted above the inclined plane 31 as shown in FIG. 7(b) such that a part of the photodiode array 20 overhangs. Received light is reflected at the inclined plane 31 having a mirror surface such that the light enters from the substrate side of the photodiode array 20. In order to improve sensitivity, a pre-amplifier 50 is placed behind the photodiode array (at a place opposite to the optical fibers with respect to the photodiode array). The Si bench 30 is mounted on a lead frame 60 so as to be electrically connected, and an optical module is produced.

As a result of evaluation of the receiving sensitivity of the optical module thus obtained, each channel had a sensitivity of −35 dBm at a transmission rate of 156 Mbps. Such an effect is obtained not only when the optical module is used as a receiver but also when it is used as a transceiver device in which a receiver device and a transmitter device are combined.

What is claimed is:

1. A photodiode array comprising a plurality of p-i-n photodiodes arrayed on a substrate, each photodiode comprising:
    a semi-insulative semiconductor substrate comprising Fe-doped indium phosphide;
    a p-type semiconductor layer on the semi-insulative semiconductor substrate;
    an i-type semiconductor layer on the p-type semiconductor layer;
    an n-type semiconductor layer on the i-type semiconductor layer;
    a p-type electrode provided on the p-type semiconductor layer; and
    an n-type electrode provided on the n-type semiconductor layer,
    wherein a trench is provided between two adjacent photodiodes, and
    wherein the photodiode array is configured so that light incident on the p-i-n photodiodes enters from the semiconductor substrate side.

2. A photodiode array according to claim 1, wherein the trench extends to the semi-insulative semiconductor substrate.

3. A photodiode array according to claim 1, wherein the trench is filled with a resin which does not transmit received light.

4. A photodiode array according to claim 1, wherein the p-type semiconductor layer comprises indium phosphide.

5. A photodiode array according to claim 1, wherein the i-type semiconductor layer comprises indium gallium arsenide.

6. A photodiode array according to claim 1, wherein the n-type semiconductor layer comprises indium phosphide.

* * * * *